United States Patent
Ganin et al.

(10) Patent No.: US 6,211,675 B1
(45) Date of Patent: Apr. 3, 2001

(54) AUTOMATIC MEASUREMENT OF GRADIENT FIELD DISTORTION

(75) Inventors: Alexander Ganin, Whitefish Bay; Kevin F. King, New Berlin, both of WI (US)

(73) Assignee: General Electric Company, Waukesha, WI (US)

(*) Notice: Subject to any disclaimer, the term of this patent is extended or adjusted under 35 U.S.C. 154(b) by 0 days.

(21) Appl. No.: 09/191,862

(22) Filed: Nov. 12, 1998

(51) Int. Cl.$^7$ .................................................. G01V 3/00
(52) U.S. Cl. ........................................... 324/318; 324/309
(58) Field of Search ...................................... 324/318, 322, 324/300, 312, 314, 307, 309

(56) References Cited

U.S. PATENT DOCUMENTS

| | | | |
|---|---|---|---|
| 4,591,789 | 5/1986 | Glover et al. | 324/307 |
| 4,698,591 | 10/1987 | Glover et al. | 324/307 |
| 4,950,994 | 8/1990 | Glover et al. | 324/320 |
| 4,965,521 | * 10/1990 | Egloff | 324/312 |
| 5,126,672 | 6/1992 | Le Roux | 324/309 |
| 5,289,127 | 2/1994 | Doddrell et al. | 324/314 |
| 5,432,449 | * 7/1995 | Ferut et al. | 324/318 |

OTHER PUBLICATIONS

Wysong, R.E., et al., "A Novel Eddy Current Compensation Scheme for Pulsed Gradient Systems," 8306 Magnetic Resonance in Medicine 31 (1994) May, No. 5, Baltimore, MD, 572–575.

Wysong, R.E., et al. "A Simple Method of Measuring Gradient Induced Eddy Currents to Set Compensation Networks," 8306 Magnetic Resonance in Medicine 29 (1993) Jan., No. 1, Duluth, MN, 119–121.

Analytical Method for the Compensation of Eddy–Current Effects Induced by Pulsed Magnetic Field Gradients in NMR Systems, Journal of Magnetic Resonance 90, 264–278 (1990), Jehenson, et al.

* cited by examiner

Primary Examiner—Louis Arana
(74) Attorney, Agent, or Firm—Quarles & Brady, LLP; Christan G. Cabou

(57) ABSTRACT

An MRI system automatically performs a calibration procedure to calculate optimal compensation parameter values for all three gradient pre-emphasis filters. A single fixture is employed to measure the errors caused by gradient pulses produced by each of the three gradient systems. The measured errors are used to calculate a gradient error function and the optimal compensation parameter values are calculated for each pre-emphasis filter by finding the minimum in the gradient error function.

11 Claims, 6 Drawing Sheets

FIG. I

AUTOMATIC MEASUREMENT OF GRADIENT FIELD DISTORTION

BACKGROUND OF THE INVENTION

The field of the invention is nuclear magnetic resonance imaging methods and systems. More particularly, the invention relates to the measurement of and subsequent compensation for non-idealities in the magnetic field gradients produced by such MRI systems.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned magnetic moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

The application of magnetic resonance to imaging, and to many of the techniques of localized spectroscopy, depend upon the use of linear magnetic field gradients to selectively excite particular regions and to encode spatial information within the NMR signal. During the NMR experiments, magnetic field gradient waveforms with particularly chosen temporal variations are used. Any departure from the application of ideal magnetic field gradient waveforms can, therefore, be expected to introduce image distortion, intensity loss, ghosting, and other artifacts. For example, imperfect rephasing of the nuclear spins and an attendant loss of signal occurs if the magnetic field gradients are not constant during selective time reversal pulses (i.e. use of 180° time reversal RF pulses). This effect compounds in later spin echoes of multi-echo (Carr-Purcell-Mieboom-Gill) sequences. In addition, if the gradient field is not zero when it should be (due to residual decay after termination of a gradient pulse), the unintended phase dispersion can result in distorted spectra in chemical shift imaging (CSI) sequences as well as inaccurate spin-spin relaxation time ($T_2$) determination in multi-echo sequences. Those skilled in the art are thus concerned particularly about the accuracy with which time varying magnetic field gradients are produced.

Distortion in the production of magnetic field gradients can arise if the gradient fields couple to lossy structures within the polarizing magnet such as its cryostat (if the magnet is of the superconductive design), or the shim coil system, or the RF shield used to decouple the gradient coils from the RF coil. One source of gradient distortions derives from the induction of currents in these ambient structures and from the loss of energy to the shim coils. These induced currents are known as eddy currents. Due to eddy currents, one observes typically an exponential rise and decay of the magnetic field gradient during and after, respectively, the application of a trapezoid current pulse to the gradient coil.

In U.S. Pat. No. 4,698,591 entitled "A Method for Magnetic Field Gradient Eddy Current Compensation," a method is disclosed which uses an analog pre-emphasis filter in the gradient power supply to shape the current applied to the gradient coil in such a way that the eddy current induced gradient field distortions are reduced. The filter includes a number of exponential decay components and adjustable potentiometers which must be set during system calibration. A measurement technique is used prior to system calibration in which the impulse response of the uncorrected magnetic field gradient is measured and the potentiometer settings for the pre-emphasis filter are then calculated. Such techniques are described in U.S. Pat. Nos. 4,950,994; 4,698,591 and 4,591,789.

The development of faster imaging techniques such as Echo Planar Imaging (EPI), together with the development of faster gradient hardware to support such techniques, have placed greater demands on the accuracy of the generated gradient fields. This in turn has placed greater demands on the calibration methods used.

Eddy currents are described by temporal dependence and by spatial dependence (spatially invariant, spatially linear, and higher orders, e.g. quadratic). For proper calibration, acquisition of eddy current data is required for each time regime and each spatial dependence. Acquisition is followed by analysis to compute optimal pre-emphasis parameters to cancel the given temporal and spatial eddy current component.

Current calibration methods employ a fixture which supports two rf coils in the magnet bore. Simultaneous data acquisition from two coils can measure only the spatially invariant or B0 eddy currents plus the spatially linear eddy currents for one gradient axis within a single acquisition. Measurement of higher spatial orders, such as quadratic, requires an additional acquisition with at least one of the coils at a different position. Data acquisition for the other gradient axes requires repositioning the coils and performing another measurement. The current measurement fixture requires the operator to initiate data acquisition and analysis for each temporal and spatial axis separately, and to perform the analysis on each temporal and spatial axis before proceeding to the next component. Multiple iterations of data acquisition and analysis are required for each component in order to compute optimal pre-emphasis values. Results vary depending on how many iterations the operator is willing to perform or has time to perform.

Because of possible variability in operator positioning of the coils, the measurement portion of the calibration process must also include a measurement of the coil positions using an NMR experiment. Because of interactions among the various components, data acquisition and analysis for the various components must be performed in a certain order to avoid erroneous results. The entire process is very time consuming, is vulnerable to operator error because of coil positioning and dependence on the precise order of operations, and depends on operator diligence to perform as many iterations as required for optimal pre-emphasis.

SUMMARY OF THE INVENTION

The present invention is a calibration fixture and method which enables the MRI system Eddy current calibration process to be performed automatically with little operator interaction. More particularly a calibration fixture supports a set of six or more calibration coils with associated samples of an MR active substance in the bore of the MRI system, and a series of measurement pulse sequences are performed in which an rf coil excites spins in all samples and NMR data is acquired from each calibration coil from which Eddy current compensation values are calculated.

One aspect of the present invention is the acquisition of eddy current calibration data from six separate calibration coils substantially simultaneously. The calibration fixture includes a multiplexer which couples each calibration coil to an MRI transmitter or receiver and enables the NMR signals produced by each calibration coil to be separately sampled and input to a receiver through a standard port available on the MRI system.

Yet another aspect of the present invention is a calibration method which is performed quickly and with little operator interaction. The fixture is mounted to the patient table and moved to the MRI system isocenter. Calibration data is then acquired for all axes and without moving the fixture. This process is done quickly because there is no need to move the fixture and there is no need to perform separate measurements of the calibration coil positions.

DESCRIPTION OF THE PREFERRED EMBODIMENT

Figure 1:
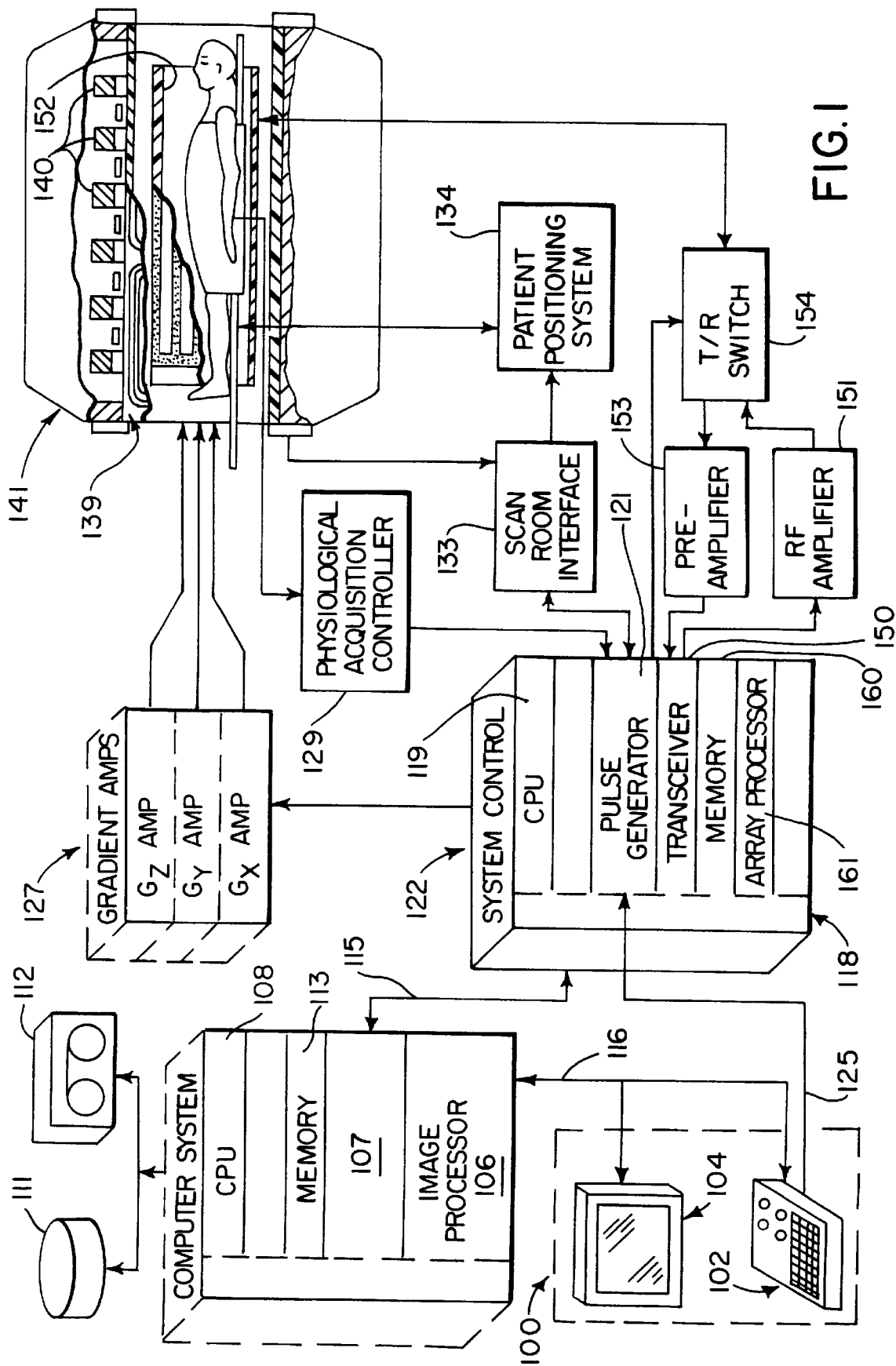
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane 118. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane. These include a CPU module 119 and a pulse generator module 121 which connects to the operator console 100 through a serial link 125. It is through this link 125 that the system control 122 receives commands from the operator which indicate the scan sequence that is to be performed. The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from a number of different sensors connected to the patient, such as ECG signals from electrodes or respiratory signals from a bellows. And finally, the pulse generator module 121 connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the linear magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are digitized by the transceiver module 150 and transferred to a memory module 160 in the system control 122. When the scan is completed and an entire array of data has been acquired in the memory module 160, an array processor 161 operates to transform the data into an array of image data. This image data is conveyed through the serial link 115 to the computer system 107 where it is stored in the disk memory 111. In response to commands received from the operator console 100, this image data may be archived on external drive 112, or it may be further processed by the image processor 106 as will be described in more detail below and conveyed to the operator console 100 and presented on the display 104.

For a more detailed description of the transceiver 150, reference is made to U.S. Pat. Nos. 4,952,877 and 4,992,736 which are incorporated herein by reference.

The present invention enables the MRI system of FIG. 1 to be periodically tested to measure the errors in the applied magnetic field gradients and calculate compensating circuit values that are used to offset the measured errors.

Figure 2:
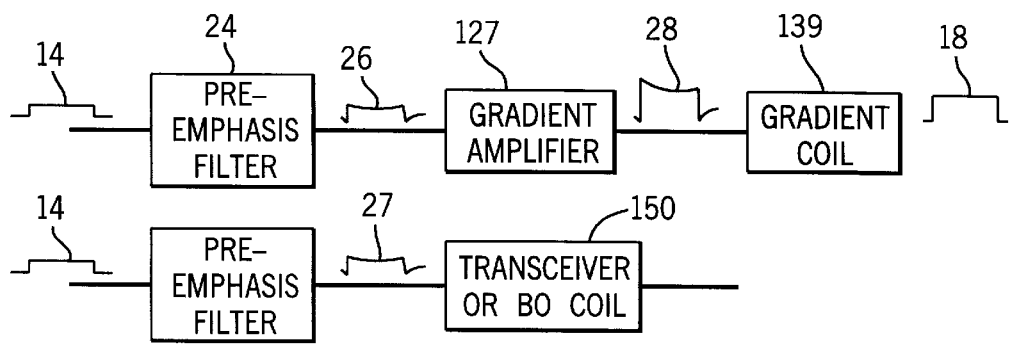
FIG. 2 is a block diagram of the gradient field producing elements which form part of the MRI system of FIG. 1.
Figure 4:
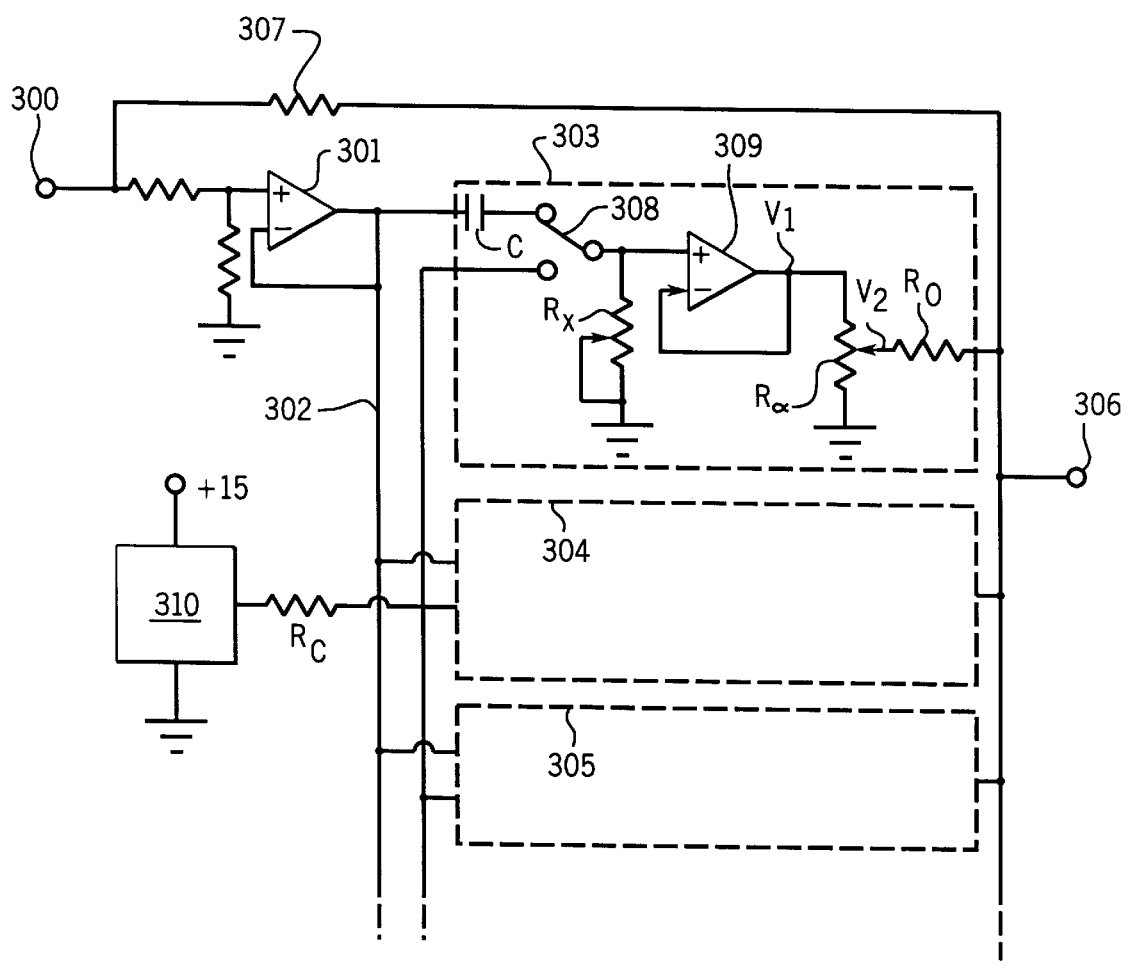
FIG. 4 is an electrical schematic diagram of the pre-emphasis filter that forms one block in FIG. 2.

As is well know in the art, gradient field distortion can be offset by application of a pre-emphasis filter 24 to the ideal gradient waveform 14 as shown in FIG. 2 in order to predistort the waveform, as indicated at 26. The pre-emphasis filter 24 can be either an analog circuit as shown in FIG. 4 or a digital filter. The pre-emphasis filter can be used to correct either the spatially invariant eddy current component or the spatially linear eddy current component. In the former case, the filter output 27 is applied either to a special coil which produces a substantially uniform magnetic field or to the transceiver 150 in order to shift the receive frequency to compensate the effect of the eddy current. In the latter case of the spatially linear eddy current, the filter output 26 is applied to the gradient amplifier 127. As a result, the amplified current pulse 28 applied to the gradient coil 139 produces the desired rectangular magnetic field gradient pulse 18. Since in a typical MR application, gradient pulses are applied in each of the axes of the Cartesian coordinate system, an MR system for practicing the invention would have means functionally similar to that depicted in FIG. 2 to achieve correction along all three axes.

In order to determine how waveform 26 to 27 in FIG. 2 should be shaped and, therefore, how pre-emphasis filter 24 should be constructed to achieve the desired shape, the nature of the distortion to be eliminated must first be measured and analyzed. This is accomplished by performing a calibration process which uses the calibration fixture shown in FIG. 6 and a measurement pulse sequence shown in FIG. 3 to acquire NMR data from which the compensation values for the pre-emphasis filter 24 are calculated.

Figure 6:
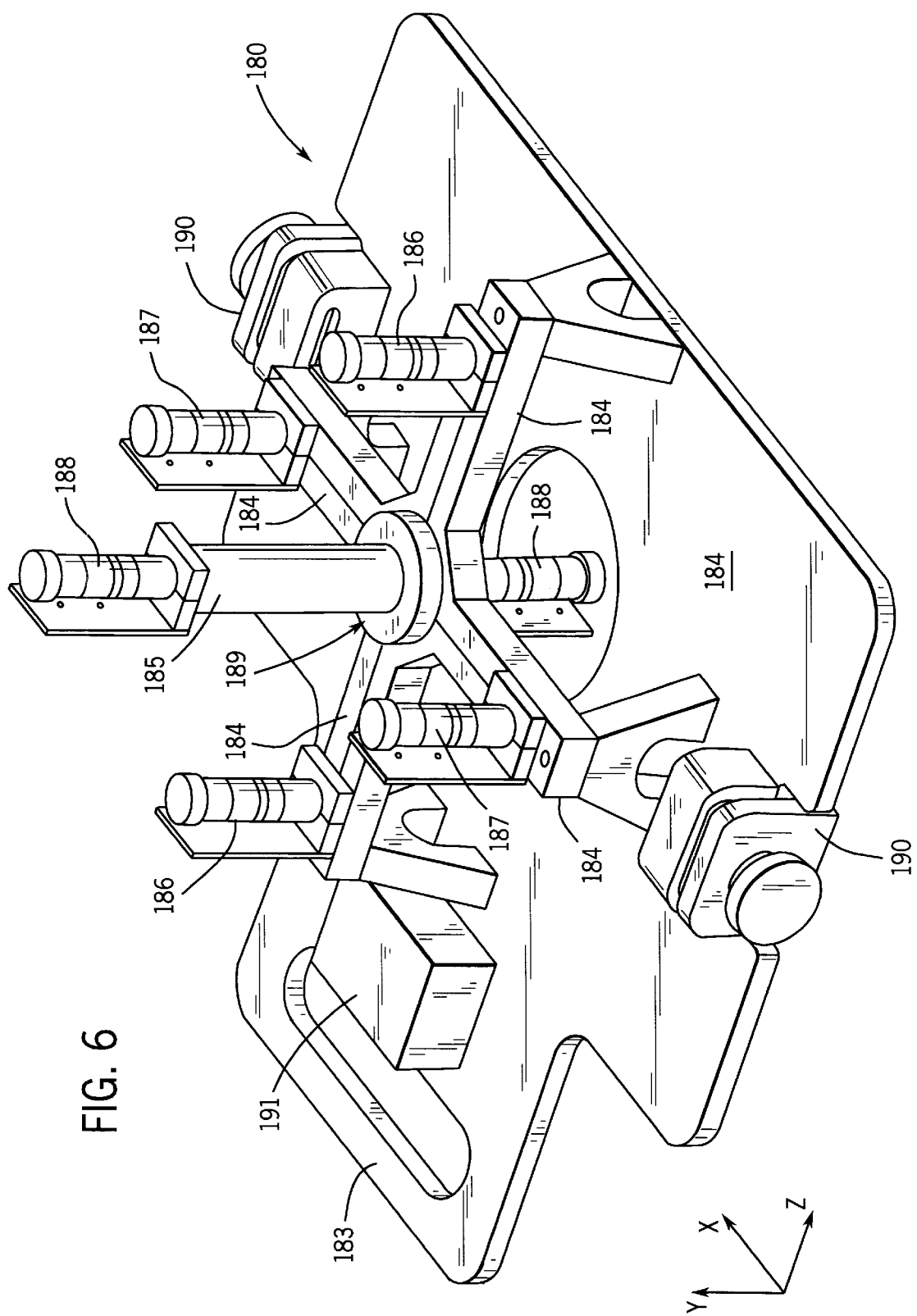
FIG. 6 is a perspective view of a preferred embodiment of the calibration fixture employed in the MRI system of FIG. 1 to practice the present invention.

Referring particularly to FIG. 6, the calibration fixture 180 includes a substantially rectangular base plate 182 made of acrylic and having an integrally formed handle 183 formed along one end. A pair of locking mechanisms 190 are mounted along each side of the base plate 182, and these engage and lock the base plate 182 to the patient table in the MRI system. The patient table is translated along the z axis to move the base plate 182 to the isocenter of the MRI system.

A coil support 189 is mounted to the base plate 182 and includes four arms 184 which extend parallel to the base plate 182 along the x and z gradient axes. A column 185 extends upward from the center of the coil support 189 along the y gradient axis.

The coil support 189 holds six calibration coil assemblies in fixed relation to one another. Two of the coil assemblies 186 are mounted on arms 184 that extend along the z gradient axis and two coil assemblies 187 are mounted to the arms 184 that extend along the x gradient axis. A fifth coil assembly 188 is mounted atop the column 185 and a sixth coil assembly 188 extends downward from the center of the coil support 189. The coil support 189 thus mounts a pair of coil assemblies 186 spaced apart and equidistant from system isocenter along the z gradient axis, a pair of coil assemblies 187 spaced apart and equidistant from system isocenter along the x gradient axis, and a pair of coil assemblies 188 spaced apart and equidistant from the system isocenter along the y gradient axis.

As will be explained in more detail below, each coil assembly includes a calibration coil which connects to circuitry housed in an enclosure 191 mounted near the handle 183. This circuitry is connected to the MRI system T/R switch 154 (FIG. 1) and it is controlled by signals from the pulse generator module 121 (FIG. 1). All elements of the fixture 180 except the electrical components are formed from materials such as acrylic which are non-conductive and which have low proton MR signal that will not interfere with the gradient fields or the NMR calibration measurements.

Figure 7:
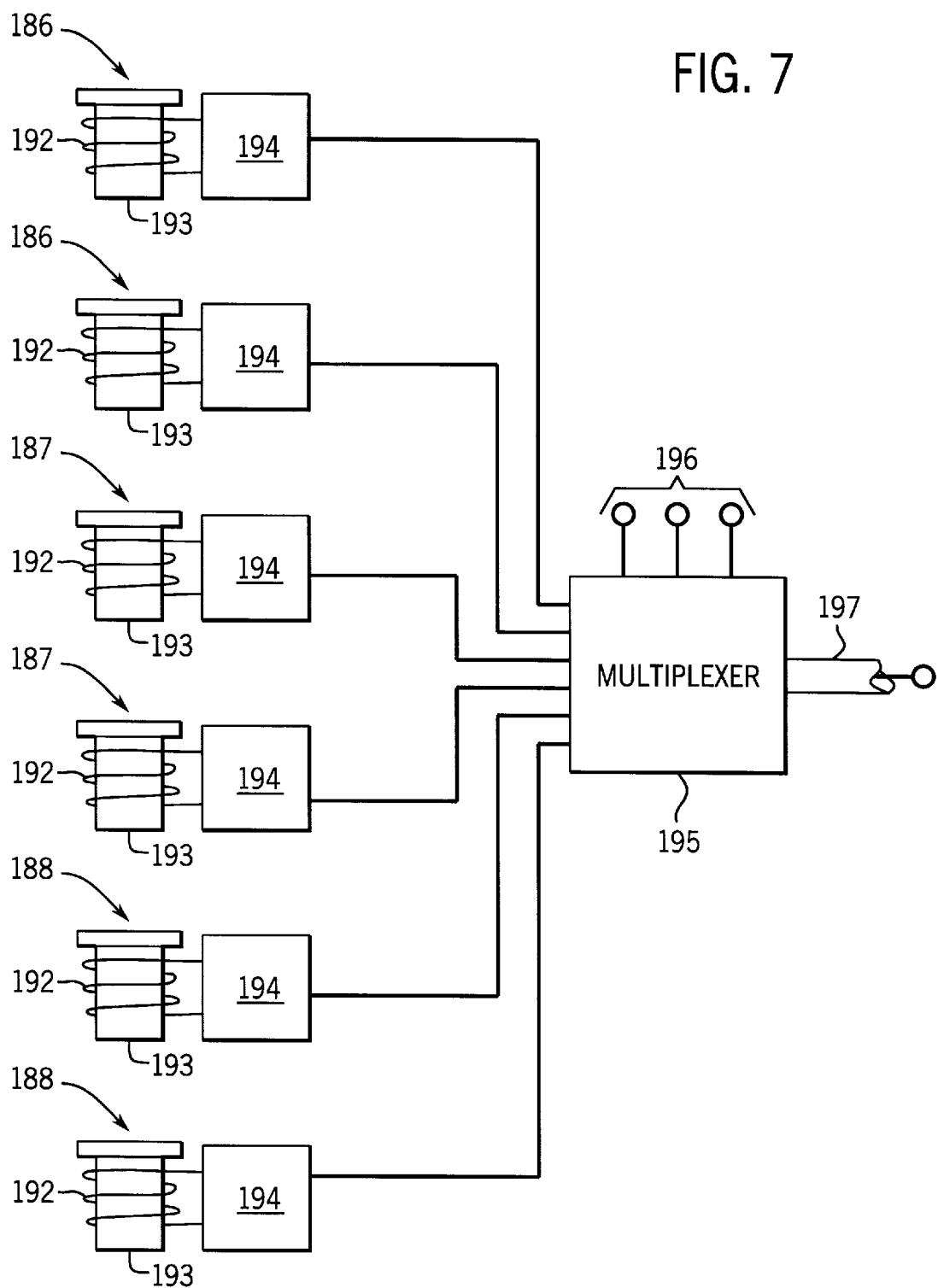
FIG. 7 is an electrical block diagram of the calibration fixture of FIG. 6.

Referring particularly to FIG. 7 each of the coil assemblies 186–188 includes a calibration coil 192 wound around a sample container 193. The sample container is a 10 mm diameter acrylic container for approximately 0.4 cc of 0.05M $CuSO_4$ doped water. These samples serve as the source of NMR signals used to measure the distortions caused by magnetic field gradient pulses. The calibration coil 192 has 6 turns around the sample container 193 and its leads are connected to a tuning circuit 194. The tuning circuit 194 is comprised of passive elements which tune the coil 192 to the Larmor frequency of the MRI system. In the preferred embodiment the calibration coils 192 are doubly tuned to the Larmor frequency of both 1.0 Tesla and 1.5 Tesla systems. In the preferred embodiment, a whole body coil is used to transmit rf power and each calibration coil is used only for receive. In a more general implementation, each calibration coil could be used for transmit and receive.

The signals produced by the six calibration coils 192 are input to an analog multiplexer 195. The multiplexer 195 is a commercially available integrated circuit which selects one of the six input signals in response to a 3-bit binary code applied to control lines 196. These control lines 196 are connected to digital outputs on the pulse generator module 121 and are operated thereby during a measurement pulse sequence described in detail below. The selected signal is output by the multiplexer through a coaxial cable 197 that connects to an input on the T/R switch 154.

Figure 3:
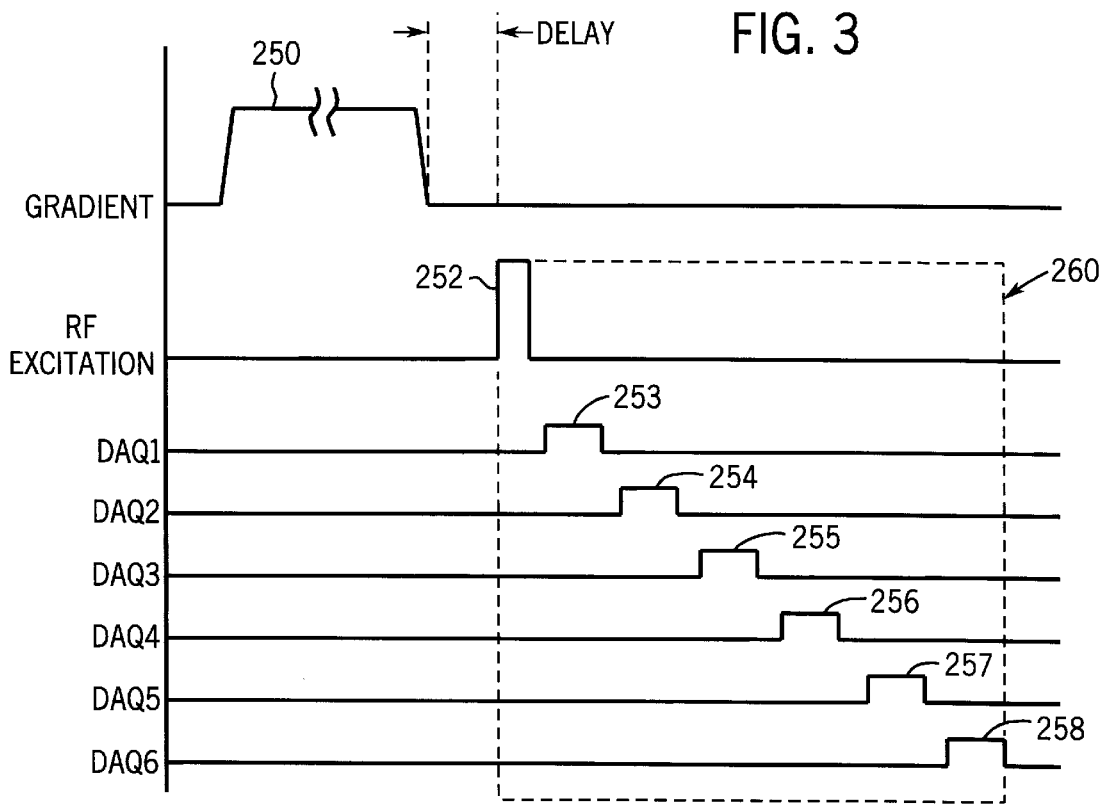
FIG. 3 is a graphic representation of a pulse sequence employed by the MRI system of FIG. 1 to practice the preferred embodiment of the invention.

FIG. 3 shows the pulse sequence employed to produce the NMR signals (FID) for one measurement time delay from each of the six calibration coils and for one gradient axis. The measurement sequence is comprised of a 400 msec. gradient pulse 250 followed by the application of non-selective 90° RF pulse 252 which generates a free induction decay FID) signal. If there are no time-dependent magnetic field components produced by the gradient pulse, then the sample object will be immersed in a homogeneous, constant magnetic field for the entire duration of the gradient pulse. As a result, the instantaneous frequency of the FID will be constant as a function of time. If, however, the gradient pulse is accompanied by time dependent magnetic field components, then the magnetic field at the sample will vary during the FID and so will the instantaneous phase and frequency of the FID signal.

By sampling the FID at various times after the gradient pulse 250 is turned off, therefore, the time dependent response of the MRI system to the gradient pulse 250 can be determined. One measurement time delay is acquired from each of the six calibration coils during six successive data acquisition windows 253–258. This is accomplished by sequencing the multiplexer 195 to sample each calibration coil signal for 1 msec with 300 $\mu$sec gaps between each coil readout and storing the values in memory module 160.

The RF excitation pulse 252 and data acquisition windows 253–258 comprise a readout block indicated by dashed lines 260. As will be described in detail below, the pulse sequence is repeated and the "delay" between the gradient pulse 250 and the readout block 260 is changed to sample over a period of from 0 to 2 seconds following the gradient pulse 250. Because Eddy currents decay exponentially after turning off the gradient pulse 250, the time intervals between samples is short at the beginning and increase as a function of time after the gradient pulse 250. The delays for the readout blocks for a complete sampling of one gradient axis are listed in Table 1.

TABLE 1

| READOUT BLOCK DELAY TIMES | | | |
|---|---|---|---|
| 0 | 120 | 320 | 850 |
| 8 | 130 | 340 | 900 |
| 16 | 140 | 360 | 950 |
| 24 | 150 | 380 | 1000 |
| 32 | 160 | 400 | 1100 |
| 40 | 170 | 440 | 1200 |
| 48 | 180 | 480 | 1300 |
| 56 | 190 | 520 | 1400 |

TABLE 1-continued

READOUT BLOCK DELAY TIMES

| | | | |
|---|---|---|---|
| 64 | 200 | 560 | 1500 |
| 72 | 220 | 600 | 1600 |
| 80 | 240 | 650 | 1700 |
| 88 | 260 | 700 | 1800 |
| 96 | 280 | 750 | 1900 |
| 104 | 300 | 800 | 2000 |
| 112 | | | |

The acquisition of the FID samples can be shortened by acquiring more than one readout block 260 after each gradient pulse 250. The primary constraint in the number of readout blocks 260 that can be acquired is the need to allow recovery of longtitudinal megnetization following each non-selective RF excitation pulse 252. In the preferred embodiment a minimum recovery time of 80 msecs. between rf pulses 252 is provided, and by parsing the sample times in Table 1 with this recovery time, all of the readout blocks can be acquired using ten gradient pulses 250. The order in which the FID is sampled is indicated in Table 2.

TABLE 2

READOUT BLOCK DELAY TIMES-PARSED

| 1 | 2 | 3 | 4 | 5 | 6 | 7 | 8 | 9 | 10 |
|---|---|---|---|---|---|---|---|---|---|
| 0 | 8 | 16 | 24 | 32 | 40 | 48 | 56 | 64 | 72 |
| 80 | 88 | 96 | 104 | 112 | 120 | 130 | 140 | 150 | |
| 160 | 170 | 180 | 190 | 200 | | | | | |
| 240 | 260 | 280 | 300 | | | | | | |
| 320 | 340 | 360 | | | | | | | |
| 400 | 440 | | | | | | | | |
| 480 | 520 | | | | | | | | |
| 560 | 600 | | | | | | | | |
| 650 | 700 | | | | | | | | |
| 750 | 800 | | | | | | | | |
| 850 | 900 | | | | | | | | |
| 950 | 1000 | | | | | | | | |
| 1100 | | | | | | | | | |
| 1200 | | | | | | | | | |
| 1300 | | | | | | | | | |
| 1400 | | | | | | | | | |
| 1500 | | | | | | | | | |
| 1600 | | | | | | | | | |
| 1700 | | | | | | | | | |
| 1800 | | | | | | | | | |
| 1900 | | | | | | | | | |
| 2000 | | | | | | | | | |

This sampling of the FID signal is performed once with the positive gradient pulse 250 and then it is repeated with the polarity of the gradient pulse 250 inverted. These FID sample acquisitions may be repeated multiple times and the signal samples averaged to improve the SNR of the "gradient error measurement". In Table 2, gradient repetitions 2 through 10 can be used to re-acquire data acquired in previous repetitions to improe signal-to-noise if desired. For example, in repetition 2, delay times 1000, 1200, 1300, etc. could also be acquired again even though they were already acquired in repetition 1. This gradient error measurement is performed once with the $G_x$ gradient, repeated with the $G_y$ gradient, and then repeated again with the $G_z$ gradient. This provides the information needed to calculate the optimum compensation parameter values for the x, y and z axis pre-emphasis filters 24 as will be described in more detail below.

Referring to FIG. 4, a preferred embodiment of the analog pre-emphasis filter 24 includes an input terminal 300 which connects to operational amplifier 301. The output of the amplifier 301 connects to bus 302 which serves as the input to a plurality of exponential circuits indicated by the dashed lines 303–305. The outputs of the exponentials circuits 303–305 connect to a common filter output terminal 306, and a feedback resistor 307 connects this filter output 306 back to the input terminal 300. Although three exponential circuits 303–305 are shown, it should be apparent that the number will depend on the results of the MR measurements and the degree of accuracy required to provide adequate results.

Referring still to FIG. 4, each exponential circuit 303–305 includes a coupling capacitor C at its input which connects through a single-pole-double throw switch 308 to an operational amplifier 309. A potentiometer $R_x$ also connects to the input of operational amplifier 309 and it forms an R-C circuit with the capacitor C. A second potentiometer $R_\alpha$ connects to the output of amplifier 309 and its wiper contact connects through a resistor $R_0$ to the filter output terminal 306. The potentiometers $R_x$ and $R_\alpha$ are adjusted to provide the proper time constant $\tau_i$ and overshoot or undershoot fraction $\alpha_i$. The adjustment is performed by a calibration step in which the switch 308 is toggled to apply a ten volt reference 310 through a resistor $R_C$ to the operational amplifier 309. The potentiometer $R_x$ is then set to provide a predetermined voltage $V_1$ at the output of the operational amplifier 309, and potentiometer $R_\alpha$ is then set to provide a predetermined voltage $V_2$ at its wiper. The predetermined voltages $V_1$ and $V_2$ are calculated using the values of $\tau_i$ and $\alpha_i$, as well as the values of the circuit components. Each exponential circuit 303–305 is separately calibrated in this fashion and the switch 308 is returned to its operating position. The pre-emphasis filter, therefore, includes one or more exponential circuits which provide the compensation to the signal applied to its input 300. It should be apparent to those skilled in the art that other gradient waveform pre-emphasis methods may be used. For example, the pre-emphasis can be done digitally as described in U.S. Pat. No. 5,289,127, entitled "Correction of Signal Distortion In An NMR Apparatus" which is incorporated herein by reference.

Figure 5:
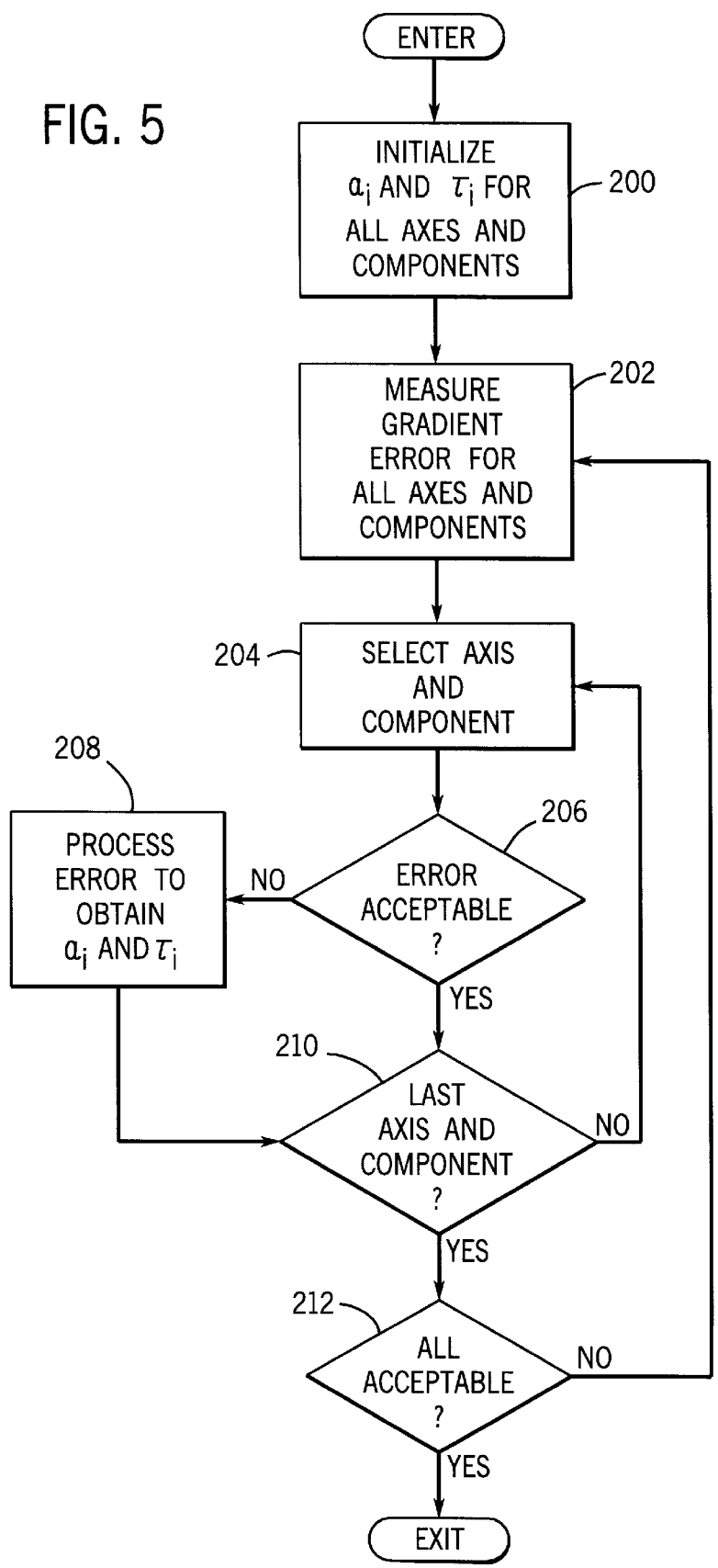
FIG. 5 is a flow chart of the calibration process used by the MRI system of FIG. 1 to practice the present invention.

The present invention is a method for automatically calculating the optimum compensation parameters $\tau_i$ and $\alpha_i$ for the pre-emphasis filter 24. The process for accomplishing this is indicated by the flow chart in FIG. 5 and it is carried out as a calibration procedure for the MRI system of FIG. 1. As a result, at the completion of the calibration process optimal compensation parameter values have been calculated for all gradient pre-emphasis filters without the need for operator intervention. The first step indicated at process block 200 is to initialize the compensation used in filter 24. The next step at process block 202 is to measure the gradient error produced by a gradient pulse 250. The gradient pulse is applied to each axis separately at block 204 for all three axes x, y and z. The time derivative of the phase of the sampled FID is calculated to measure the magnetic field at each calibration coil location. The magnetic fields at the calibration coil location are combined using methods well known to those skilled in the art to calculate the spatially invariant and spatially linear components of the gradient error when the gradient pulse 250 is applied on any particular axis. For example, when the gradient pulse 250 is applied on the x axis, the gradient error component which is spatially invariant, and the components which vary linearly in the x, y and z directions are measured. If the error for a given spatial component is large enough to cause image quality degradation as determined at decision block 206, the error is processed at block 208 to obtain pre-emphasis parameters $\alpha_i$ and $\tau_i$ for that component using methods well known to those skilled in the art. After pre-emphasis parameters are determined for each spatial component and each axis for the gradient pulse 250 as determined at decision block 210, the gradient error is remeasured and the process repeated. When the gradient error is too small to cause image quality problems for each component and each gradient pulse axis as determined at decision block 212, the process terminates.

What is claimed is:

1. An MRI calibration system which comprises:
   a) a fixture mounted in the MRI system at a location in which a polarizing magnetic field and gradient magnetic fields are produced by the MRI system during its operation, the fixture including:
   a first pair of calibration coil assemblies disposed along a first gradient axis;
   a second pair of calibration coil assemblies disposed along a second gradient axis; and;
   a third pair of calibration coil assemblies disposed along a third gradient axis;
   wherein each calibration coil assembly includes a calibration coil and a sample material which produces an NMR signal when excited by the MRI system;
   b) a multiplexer having inputs connected to each of the calibration coils and an output coupled to a transceiver on the MRI system; and
   the MRI system includes a pulse generator which operates the multiplexer and the MRI system during a calibration procedure to acquire NMR data from each of the calibration coils.

2. The calibration system as recited in claim 1 in which the fixture is mounted to a patient table in the MRI system and is located at a system isocenter.

3. The calibration system as recited in claim 1 in which the multiplexer is mounted on the fixture.

4. The calibration system as recited in claim 1 in which the fixture includes:
   a base plate
   a coil support mounted to the base plate and having a first pair of arms that extend in opposite directions along said first gradient axis and support said first pair of calibration coil assemblies, and having a second pair of arms that extend in opposite directions along said second gradient axis and support said second pair of calibration coil assemblies.

5. The calibration system as recited in claim 4 in which the coil support has a column which extends along said third gradient axis and supports at one end one calibration coil assembly in said third pair of calibration coil assemblies.

6. The MRI calibration system as recited in claim 1 in which said first, second and third pairs of calibration coils are doubly tuned to two separate Larmor frequencies.

7. A method for measuring eddy current errors in NMR signals produced by magnetic field gradient pulses in MRI systems, the steps comprising:
   a) mounting a fixture in the MRI system which contains three pairs of calibration coils disposed along three corresponding magnetic field gradient axes of the MRI system;
   b) performing a measurement pulse sequence with the MRI system in which a magnetic field gradient pulse is produced along one of said three axes, an RF excitation pulse is produced a selected time delay after the magnetic field gradient pulse, and NMR signals received by each of said calibration coils are sampled;
   c) repeating step b) at a plurality of different selected time delays; and
   d) calculating the eddy current errors from the sampled NMR signals.

8. The method as recited in claim 7 in which the RF excitation pulse is non-selective and NMR signals are received by all six calibration coils.

9. The method as recited in claim 7 in which a multiplexer connects each of the six calibration coils to a receiver in the MRI system and the measurement pulse sequence includes:
   operating the multiplexer to sequentially sample the NMR signal from each of the six calibration coils.

10. The method as recited in claim 7 in which at least one of the measurement pulse sequences includes producing a plurality of RF excitation pulses at a plurality of selected time delays after the magnetic field gradient pulse and NMR signals received by each of said calibration coils after each of said plurality of RF excitation pulses are sampled.

11. The method as recited in claim 7 in which the NMR signal received by each calibration coil is produced by placing an NMR active sample material adjacent to each of the calibration coils.

* * * * *